United States Patent
Tsao et al.

(10) Patent No.: US 10,868,065 B2
(45) Date of Patent: *Dec. 15, 2020

(54) FRONT SIDE ILLUMINATED IMAGE SENSOR DEVICE STRUCTURE AND METHOD FOR FORMING THE SAME

(71) Applicant: Taiwan Semiconductor Manufacturing Co., Ltd., Hsinchu (TW)

(72) Inventors: Tsun-Kai Tsao, Tainan (TW); Shih-Pei Chou, Tainan (TW); Jiech-Fun Lu, Tainan (TW)

(73) Assignee: TAIWAN SEMICONDUCTOR MANUFACTURING CO., LTD, Hsinchu (TW)

( * ) Notice: Subject to any disclaimer, the term of this patent is extended or adjusted under 35 U.S.C. 154(b) by 0 days.

This patent is subject to a terminal disclaimer.

(21) Appl. No.: 16/427,484

(22) Filed: May 31, 2019

(65) Prior Publication Data

US 2019/0305026 A1  Oct. 3, 2019

Related U.S. Application Data

(63) Continuation of application No. 15/644,022, filed on Jul. 7, 2017, now Pat. No. 10,312,278.

(60) Provisional application No. 62/478,664, filed on Mar. 30, 2017.

(51) Int. Cl.
*H01L 27/146* (2006.01)

(52) U.S. Cl.
CPC .. *H01L 27/14623* (2013.01); *H01L 27/14614* (2013.01); *H01L 27/14621* (2013.01); *H01L 27/14627* (2013.01); *H01L 27/14685* (2013.01)

(58) Field of Classification Search
CPC ................................................ H01L 27/14623
See application file for complete search history.

(56) References Cited

U.S. PATENT DOCUMENTS

| | | | |
|---|---|---|---|
| 10,312,278 B2 * | 6/2019 | Tsao | H01L 27/14614 |
| 2002/0094613 A1 | 7/2002 | Yamazaki et al. | |
| 2007/0187787 A1 | 8/2007 | Ackerson et al. | |
| 2012/0299066 A1 | 11/2012 | Kato et al. | |
| 2012/0300106 A1 * | 11/2012 | Kobayashi | H01L 27/14614 348/308 |
| 2013/0127003 A1 | 5/2013 | Arakawa | |
| 2014/0091378 A1 | 4/2014 | Hashimoto | |
| 2015/0009388 A1 | 1/2015 | Kobayashi et al. | |
| 2015/0076643 A1 | 3/2015 | Kikuchi | |
| 2018/0097032 A1 | 4/2018 | Nakatsuka et al. | |

* cited by examiner

*Primary Examiner* — Thao X Le
*Assistant Examiner* — Laura M Dykes
(74) *Attorney, Agent, or Firm* — McClure, Qualey & Rodack, LLP (57) ABSTRACT

An FSI image sensor device structure is provided. The FSI image sensor device structure includes a pixel region formed in a substrate and a storage region formed in the substrate and adjacent to the pixel region. The FSI image sensor device structure further includes a first gate structure formed over the storage region and a metal shield structure formed over the first gate structure. The FSI image sensor device structure further includes a conductive structure formed adjacent to the first gate structure. In addition, the conductive structure is electrically connected to the metal shield structure through a via.

21 Claims, 11 Drawing Sheets

FRONT SIDE ILLUMINATED IMAGE SENSOR DEVICE STRUCTURE AND METHOD FOR FORMING THE SAME

CROSS REFERENCE TO RELATED APPLICATIONS

This application is a Continuation application of U.S. patent application Ser. No. 15/644,022, filed on Jul. 7, 2017, now U.S. Pat. No. 10,312,278, which claims the benefit of U.S. Provisional Application No. 62/478,664, filed on Mar. 30, 2017, the entire of which is incorporated by reference herein.

BACKGROUND

Semiconductor devices are used in a variety of electronic applications, such as personal computers, cell phones, digital cameras, and other electronic equipment. Semiconductor devices are typically fabricated by sequentially depositing insulating or dielectric layers, conductive layers, and semiconductive layers of material over a semiconductor substrate, and patterning the various material layers using lithography to form circuit components and elements thereon. Many integrated circuits are typically manufactured on a single semiconductor wafer, and individual dies on the wafer are singulated by sawing between the integrated circuits along a scribe line. The individual dies are typically packaged separately, in multi-chip modules, for example, or in other types of packaging.

An image sensor is used to convert an optical image focused on the image sensor into an electrical signal. The image sensor includes an array of light-detecting elements, such as photodiodes, and a light-detecting element is configured to produce an electrical signal corresponding to the intensity of light impinging on the light-detecting element. The electrical signal is used to display a corresponding image on a monitor or provide information about the optical image.

Although existing image sensor device structures and methods for forming the same have generally been adequate for their intended purpose they have not been entirely satisfactory in all respects.

BRIEF DESCRIPTION OF THE DRAWINGS

Aspects of the present disclosure are best understood from the following detailed description when read with the accompanying figures. It should be noted that, in accordance with the standard practice in the industry, various features are not drawn to scale. In fact, the dimensions of the various features may be arbitrarily increased or reduced for clarity of discussion.

DETAILED DESCRIPTION

The following disclosure provides many different embodiments, or examples, for implementing different features of the subject matter provided. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Some variations of the embodiments are described. Throughout the various views and illustrative embodiments, like reference numbers are used to designate like elements. It should be understood that additional operations can be provided before, during, and after the method, and some of the operations described can be replaced or eliminated for other embodiments of the method.

Embodiments for a front side illuminated (FSI) image sensor device structure and method for forming the same are provided. FIGS. 1A-1H show cross-sectional representations of various stages of forming a FSI image sensor device structure 100, in accordance with some embodiments of the disclosure. The FSI image sensor device structure 100 includes a pixel region, a storage region and a storage gate structure formed on the storage region. A metal shield structure covers a top surface and sidewall surfaces of the storage gate structure to prevent unwanted stray light from entering the storage gate structure and/or the storage region.

Figure 1A:
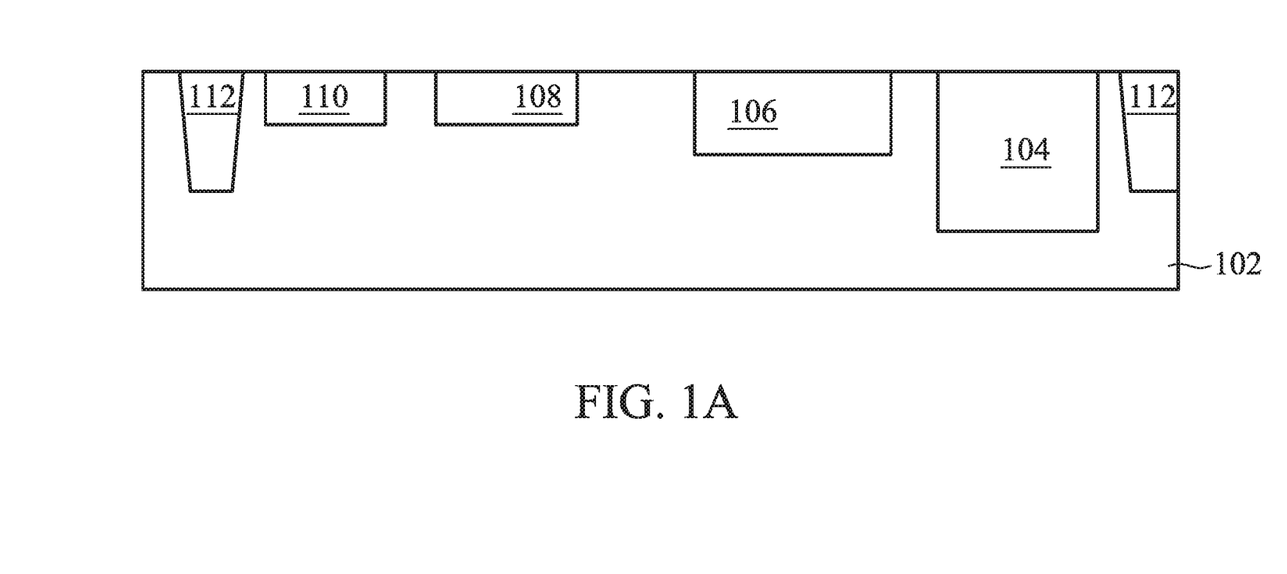
FIGS. 1A-1H show cross-sectional representations of various stages of forming a FSI image sensor device structure, in accordance with some embodiments of the disclosure.

Referring to FIG. 1A, a substrate 102 is provided. The substrate 102 may be made of silicon or other semiconductor materials. In some embodiments, the substrate 102 is a wafer. Alternatively or additionally, the substrate 102 may include other elementary semiconductor materials such as germanium. In some embodiments, the substrate 102 is made of a compound semiconductor or alloy semiconductor, such as silicon carbide, gallium arsenic, indium arsenide, or indium phosphide, silicon germanium, silicon germanium carbide, gallium arsenic phosphide, or gallium indium phosphide. In some embodiments, the substrate 102 includes an epitaxial layer. For example, the substrate 102 has an epitaxial layer overlying a bulk semiconductor.

A pixel region 104 is formed in the substrate 102. The pixel region 104 may include photosensitive elements. The photosensitive elements may include a photodiode, a partially pinned photodiode, a pinned photodiode, or a photocapacitor. The pixel region 104 may be a doped region doped with n-type and/or p-type dopants. The pixel region 104 may be formed by an ion implantation process, a diffusion process or another applicable process.

A storage region 106 is adjacent to the pixel region 104. The storage region 106 is configured to temporarily store a charge. The storage region 106 should not be exposed to incoming light. The storage region 106 may be a doped region doped with n-type and/or p-type dopants. The storage region 106 may be formed by an ion implantation process, a diffusion process or another applicable process.

A floating node region 108 is adjacent to the storage region 106. The floating node region 108 is between the storage region 106 and a doped region 110. The floating node region 108 may be a doped region doped with n-type and/or p-type dopants. The floating node region 108 may be formed by an ion implantation process, a diffusion process or another applicable process.

The doped region 110 is adjacent to the floating node region 108. The doped region 110 may be a doped region doped with n-type and/or p-type dopants. The doped region 110 may be formed by an ion implantation process, a diffusion process or another applicable process.

An isolation structure 112 is formed in the substrate 102. The isolation structure 112 may define and isolate various integrated circuit devices. The isolation structure 112 may be shallow trench isolation (STI) structures or local oxidation of silicon (LOCOS) structures. In some embodiments, the isolation structure 112 is formed in the well region (not shown).

Figure 1B:
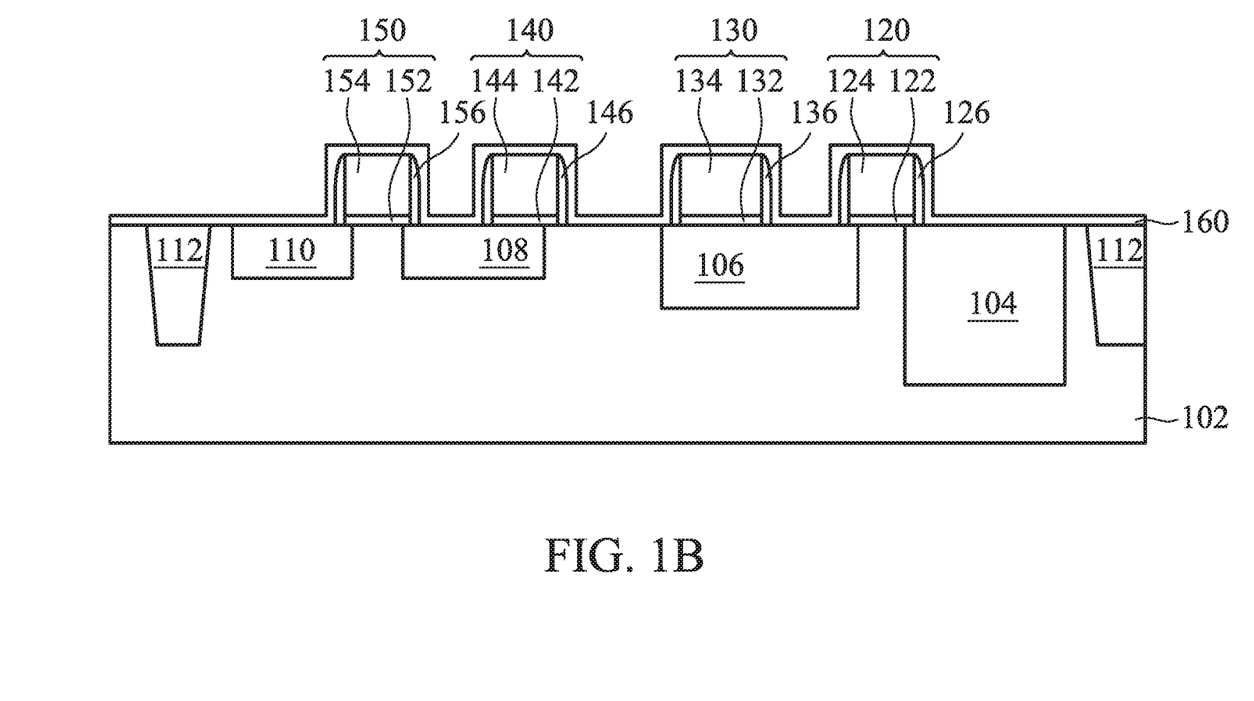

Afterwards, as shown in FIG. 1B, a number of gate structure including a first gate structure 120, a second gate structure 130, a third gate structure 140, and a fourth gate structure 150 are formed on the substrate 102, in accordance with some embodiments of the disclosure. Each of the gate structure 120, 130, 140, 150 has a respective function to operate the image sensor device structure. In some embodiments, the first gate structure 120 is a transfer gate structure, the second gate structure 130 is the storage gate structure, and the third gate structure 140 is transfer gate structure and the fourth gate structure 140 is the reset gate structure. In some embodiments, the first gate structure 120 is the transfer gate structure and it between the pixel region 104 and the storage region 106. The transfer gate structure 120 controls the flow of electrons from the pixel region 104 to the storage region 106. In some embodiments, the second gate structure 130 is the storage gate structure and it controls the flow of electrons from the storage region 106 to the floating node region 108.

The first gate structure 120 includes a first gate dielectric layer 122 and a first gate electrode layer 124. A pair of first gate spacer layers 126 are formed on sidewall surfaces of the first gate structure 120. The first gate dielectric layer 122 may be a single layer or multiple layers. The first gate dielectric layer 122 may be made of silicon oxide (SiOx), silicon nitride (SixNy), silicon oxynitride (SiON), dielectric material(s) with high dielectric constant (high-k), or a combination thereof. In some embodiments, the first gate dielectric layer 122 is formed by a deposition process, such as a chemical vapor deposition (CVD) process, a plasma enhanced chemical vapor deposition (PECVD) process, a spin coating process or another applicable process.

The first gate electrode layer 124 may be made of conductive material, such as aluminum (Al), copper (Cu), tungsten (W), titanium (Ti), tantalum (Ta), or another applicable material. The first gate electrode layer 124 may be formed by a deposition process, such as chemical vapor deposition (CVD), physical vapor deposition (PVD), atomic layer deposition (ALD), or another applicable process.

The first gate spacer layers 126 may be made of silicon oxide, silicon nitride, silicon oxynitride or another applicable material. In some embodiments, the first gate spacer layers 126 are formed by a chemical vapor deposition (CVD) process, a physical vapor deposition (PVD) process, or another applicable process.

The second gate structure 130 includes a second gate dielectric layer 132 and a second gate electrode layer 134. A pair of second gate spacer layers 136 are formed on the sidewall surfaces of the second gate structure 130. The third gate structure 140 includes a third gate dielectric layer 142 and a third gate electrode layer 144. A pair of third gate spacer layers 146 are formed on the sidewall surfaces of the third gate structure 140. The fourth gate structure 150 includes a fourth gate dielectric layer 152 and a fourth gate electrode layer 154. A pair of fourth gate spacer layers 156 are formed on the sidewall surfaces of the fourth gate structure 150.

The second gate dielectric layer 132, the third gate dielectric layer 142 and the fourth gate dielectric layer 152 may be independently made of silicon oxide (SiOx), silicon nitride (SixNy), silicon oxynitride (SiON), dielectric material(s) with high dielectric constant (high-k), or a combination thereof. The second gate electrode layer 134, the third gate electrode layer 144, and the fourth gate electrode layer 154 may be independently made of conductive material, such as aluminum (Al), copper (Cu), tungsten (W), titanium (Ti), tantalum (Ta), or another applicable material. The second gate spacer layers 136, the third gate spacer layers 146 and the fourth gate spacer layers 156 may be independently made of silicon oxide, silicon nitride, silicon oxynitride or another applicable material.

Afterwards, an etching stop layer 160 is formed on the first gate structure 120, the second gate structure 130, the third gate structure 140, and the fourth gate structure 150, and on the substrate 102. In some embodiments, the etching stop layer 160 is made of silicon oxide (SiOx), silicon carbide (SiC), silicon nitride (SixNy), silicon carbonitride (SiCN), silicon oxycarbide (SiOC), silicon oxycarbon nitride (SiOCN), or another applicable material.

Figure 1C:
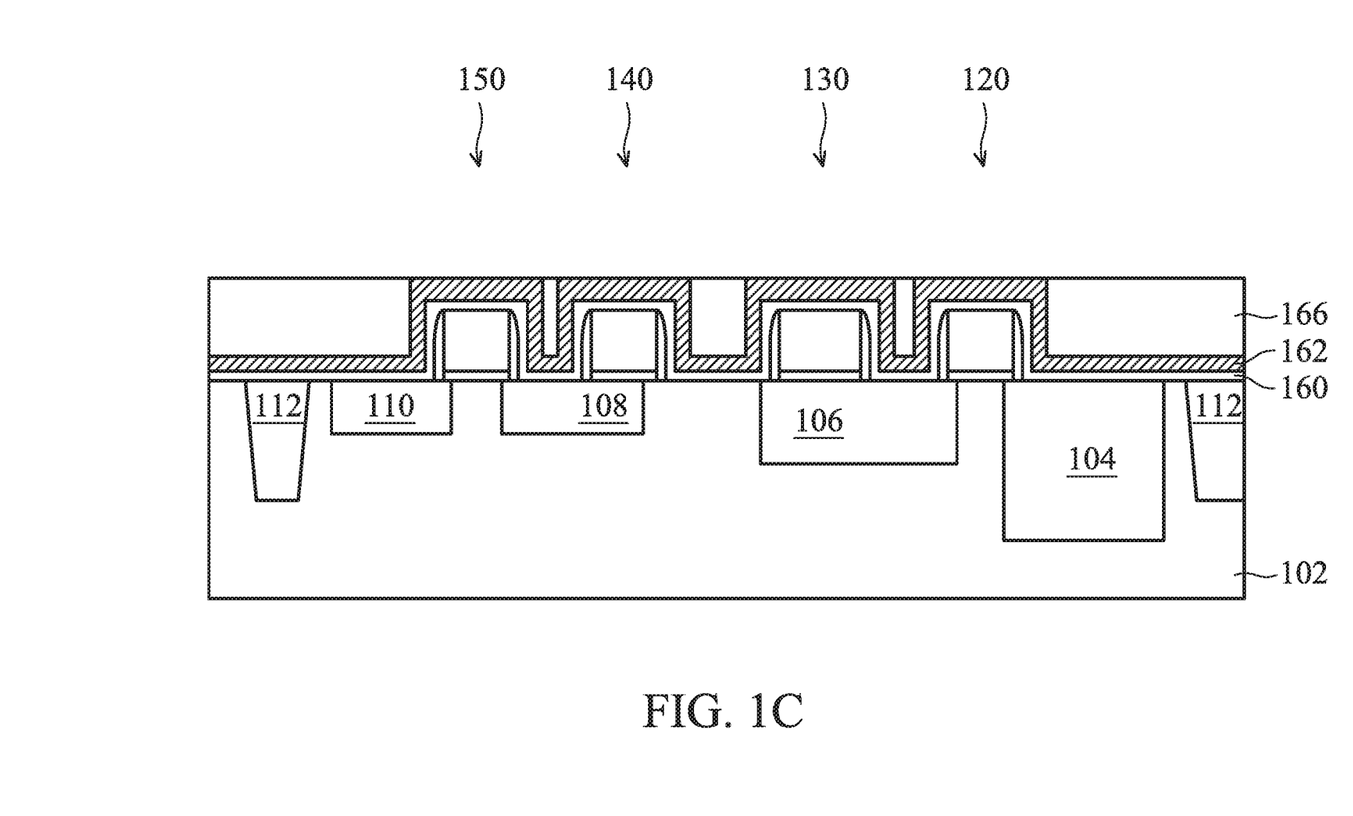

Afterwards, as shown in FIG. 1C, a conductive material 162 is conformally formed on the first gate structure 120, the second gate structure 130, the third gate structure 140, the fourth gate structure 150, and the substrate 102, in accordance with some embodiments of the disclosure. The conductive material 162 is configured to form a shield structure 164 (shown in FIG. 1E), and therefore the shield structure 164 has properties that block or reflect the light and prevent the incoming light from entering the underlying second gate structure 130 (e.g. the storage gate structure).

In some embodiments, the conductive material 162 is made of metal materials, such as tungsten (W), copper (Cu), aluminum (Al), titanium (Ti), tantalum (Ta), nickel (Ni), silver (Ag), gold (Au), indium (In), tin (Sn), or a combination thereof. In some embodiments, the conductive material 162 is formed by electro-plating, electroless plating, sputtering, chemical vapor deposition (CVD) or another applicable process. Although the shielding effect is increased as the thickness of the conductive material 162 is increased, the fabrication time and cost will increase. In some embodiments, the conductive material 162 has a thickness in a range from about 120 nm to about 150 nm. If the thickness of the conductive material 162 is too small, the shielding effect may be insufficient. If the conductive material 162 is over-deposited, a portion of the conductive material 162 may be wasted. When the thickness of the conductive material 162 is within the above-mentioned range, the shielding effect is better.

Since the conductive material 162 is conformally formed on the gate structures 120, 130, 140 and 150, the shape of the conductive material 164 follows the shape of the gate structures 120, 130, 140 and 150. In other words, the conductive material 162 includes a first portion and a second portion, the first portion is directly on the gate structures 120, 130, 140 and 150, and the second portion is directly on the substrate 102. The first portion is above or higher than the second portion, and there is a gap between the first portion and the second portion. In order to compensate for the gap, a dielectric layer 166 is formed in the gap. As a result, a top surface of the dielectric layer 166 is level with a top surface of the first portion of the conductive material 164.

In some embodiments, the dielectric layer 166 made of anti-reflective material, such as a bottom anti-reflective coating (BARC). The anti-reflective material may be made of organic or inorganic materials. The inorganic materials may include silicon nitride, silicon oxynitride, titanium nitride, silicon carbide, or other applicable materials. The organic materials may include polyimides, polysulfones or other applicable materials.

Figure 1D:
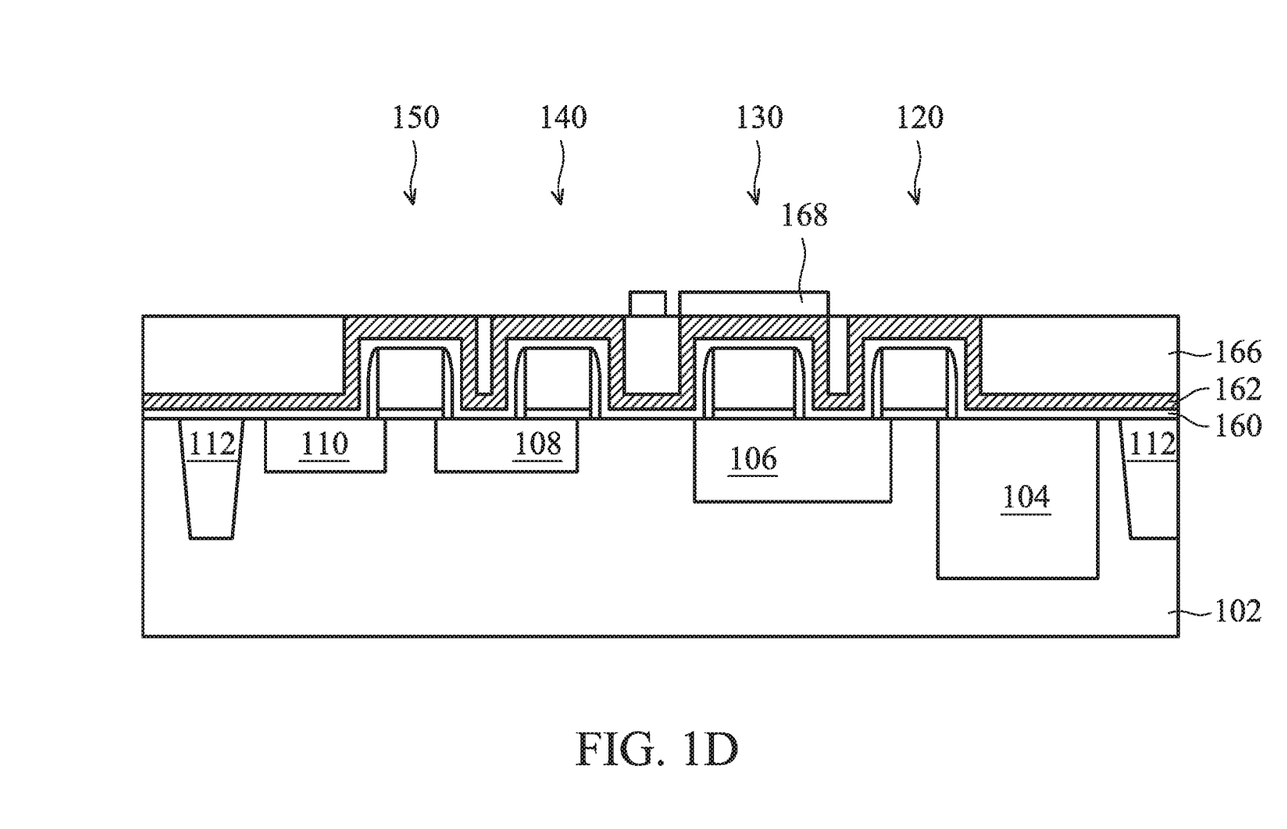

Afterwards, as shown in FIG. 1D, a hard mask layer 168 is formed over the dielectric layer 166 and the conductive material 162, in accordance with some embodiments of the disclosure.

Afterwards, the hard mask layer 168 is patterned by a patterning process to have a patterned hard mask layer 168. The patterning process includes a photolithography process and an etching process. Examples of a photolithography process include soft baking, mask aligning, exposure, post-exposure baking, developing the photoresist, rinsing and drying (e.g., hard baking). The etching process may be a dry etching or a wet etching process.

As a result, a portion of the conductive material 162 is covered by the patterned hard mask layer 168. Next, an etching process is performed to remove a portion of the dielectric layer 166 and a portion of the conductive material 164 which are not covered or protected by the patterned hard mask layer 168. In some embodiments, the etching process includes multiple etching processes. In some embodiments, the etching process is a dry etching process. Afterwards, the remaining dielectric layer 166 and the patterned hard mask layer 168 are sequentially removed.

Figure 1E:
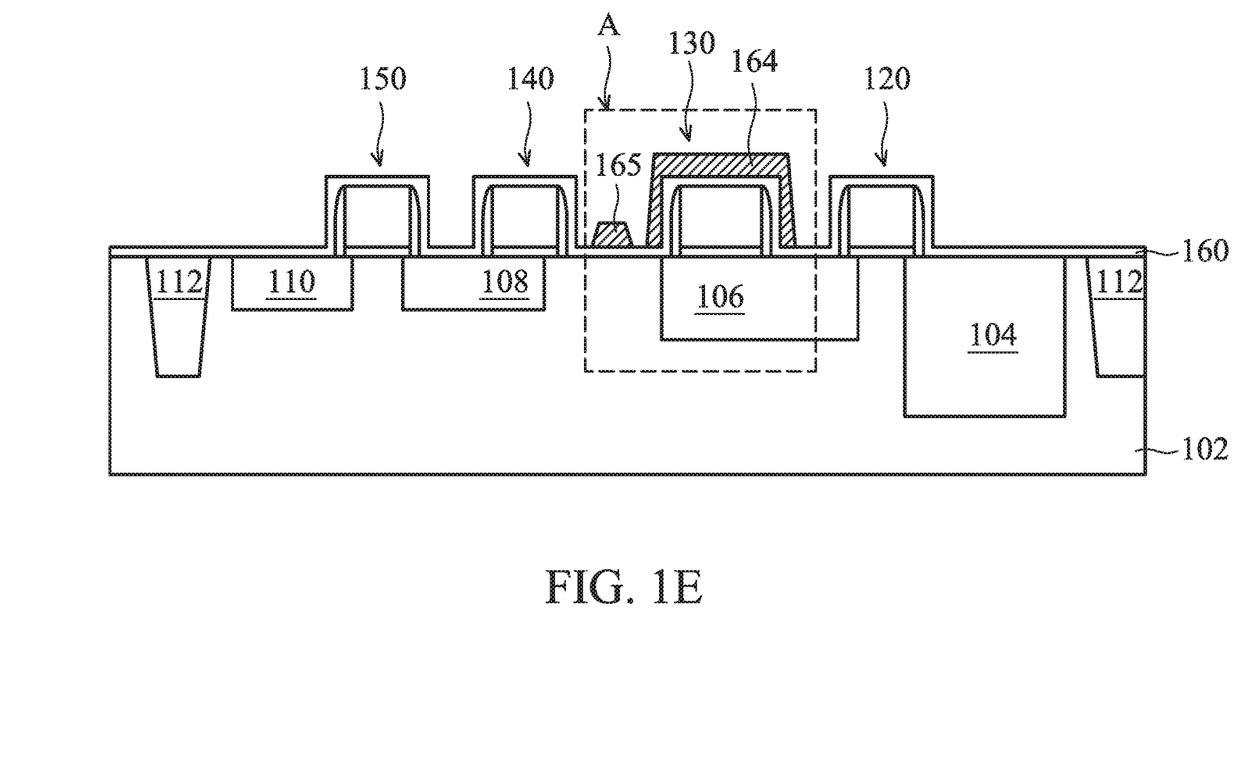

Afterwards, as shown in FIG. 1E, a metal shield structure 164 and a conductive structure 165 adjacent to the metal shield structure 164 are formed, in accordance with some embodiments of the disclosure.

When the FSI image sensor device structure 100 is operated in global shutter mode, the pixel region 104 is configured to detect the incoming light and the storage region 106 is configured to temporarily store a charge. The second gate structure 130 and the storage region 106 should not be exposed to incoming light. However, unwanted stray light may strike the second gate structure 130 and/or the storage region 106 adjacent to the pixel region 104, and result in undesired crosstalk and reduction in global shutter efficiency.

In order to prevent the light from entering the second gate structure 130 and the storage region 1006, the metal shield structure 164 is formed on and covers the top surface and sidewall surface of the second gate structure 130. More specifically, the second gate structure 130 is completely surrounded by the metal shield structure 164. In addition, the metal shield structure 164 at least partially covers the storage region 106.

Note that if the conductive material 162 is removed by a polishing process, such as a chemical mechanical polishing (CMP) process, the uniformity of thickness of the conductive material 162 is poor due to the loading effect and/or the dishing effect caused by the CMP process. For example, the thickness of the conductive material in the central region may be not equal to the thickness of the conductive material in the peripheral region. If the uniformity of thickness of the metal shield structure 164 is poor, the light blocking effect of the metal shield structure 164 may degrade.

Furthermore, if the conductive material 162 is removed by a chemical mechanical polishing process (CMP) process, a higher/thicker conductive material 162 would be required to compensate for excess material removal. In other words, in order to prevent the conductive material 162 from being damaged by the CMP process, the conductive structure 162 has to be over-deposited. However, the over-deposited material of the conductive material 162 constitutes an extra waste of material as it will be removed by the subsequent CMP process.

The conductive material 164 and the conductive structure 165 of the disclosure are formed by depositing the conductive material 162 and then removing a portion of the conductive material 162 in an etching process. Compared with a shield structure formed by a CMP process, the uniformity of the thickness of the conductive material 164 is better, improving the performance of the image sensor device structure 100.

Figure 2:
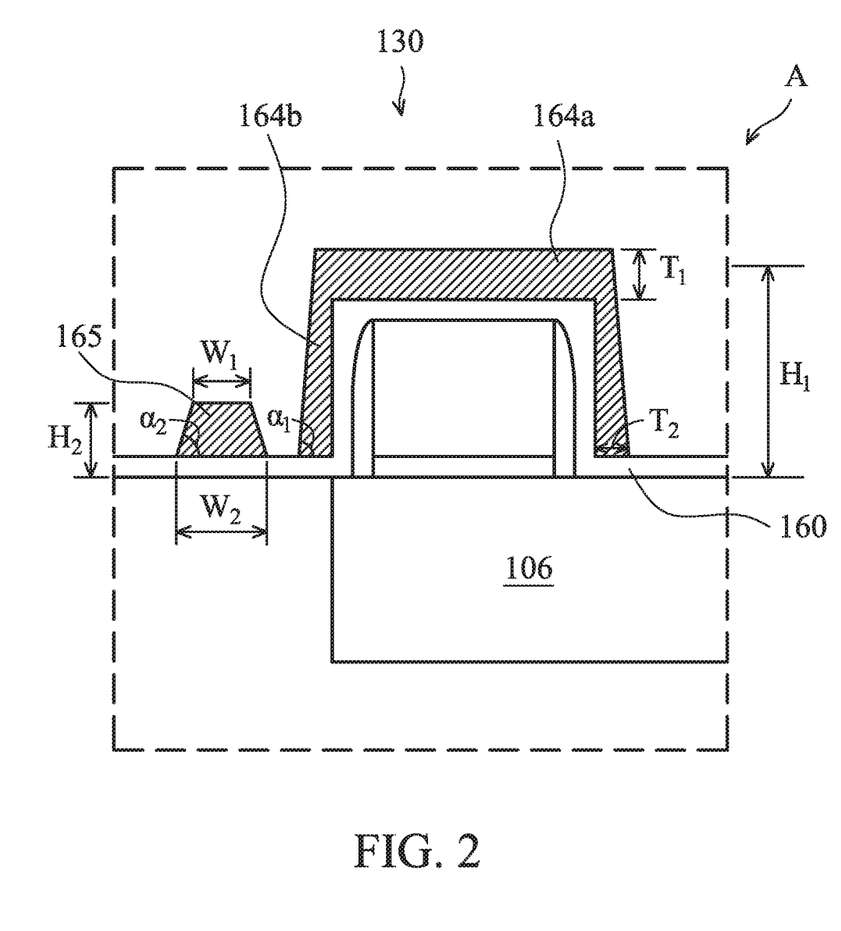
FIG. 2 shows an enlarged cross-sectional representation of a region A of FIG. 1E, in accordance with some embodiments of the disclosure.

FIG. 2 shows an enlarged cross-sectional representation of a region A of FIG. 1E, in accordance with some embodiments of the disclosure.

As shown in FIG. 2, the metal shield structure 164 has a top portion 164a and a sidewall portion 164b. The top portion 164a is on a top surface of the second gate structure 130 (e.g. the storage gate structure), and the sidewall portion 164b is on the sidewall surfaces of the second gate structure 130. The sidewall portion 164b has a tapered width from bottom to top. In other words, the sidewall portion 164b has a width which is gradually tapered from bottom to top. A first angle α1 is between a top surface of the substrate 102 and a sidewall surface of the metal shield structure 164 when measured clockwise. The first angle α1 is smaller than 90 degrees due to the metal shield structure 164 is formed by the etching process. In some embodiments, the first angle α1 is in a range from about 75 degrees to about 88 degrees.

The conductive structure 165 has a top surface with a first width $W_1$ and a bottom surface with a second width $W_2$. The first width $W_1$ is smaller than the second width $W_2$. A second angle α2 is between a top surface of the substrate 102 and a sidewall surface of the conductive structure 165 when measured clockwise. In some embodiments, the second angle $α_2$ is in a range from about 75 degrees to about 88 degrees.

The metal shield structure 164 has a first height $H_1$ measured from a top surface of the substrate 102 to a top surface of the metal shield structure 164. The conductive structure 165 has a second height $H_2$ measured from the top surface of the substrate 102 to the top surface of the conductive structure 165. The first height $H_1$ is greater than the second height $H_2$. In addition, the top surface of the second gate structure 130 is higher than the top surface of the conductive structure 165 and lower than the top surface of the metal shield structure 164.

The top portion 164a of the metal shield structure 164 has a first thickness $T_1$ which is measured from a top surface of the etching stop layer 160 to a top surface of the metal shield structure 164 in a vertical direction. In some embodiments, the first thickness $T_1$ is in a range from about 120 nm to about 150 nm. If the first thickness $T_1$ is too small, the shielding effect may be insufficient. If the metal shield structure 164 is over-deposited, a portion of the metal shield structure 164 may be wasted. When the first thickness $T_1$ of the top portion 164a of the metal shield structure 164 is within the above-mentioned range, the shielding effect or the light blocking effect is better.

A bottom surface of the sidewall portion 164b of the metal shield structure 164 has a second thickness $T_2$ which is measure from an inner sidewall to an outer sidewall of the sidewall portion 164b in a horizontal direction. In some embodiments, the first thickness $T_1$ is greater than the second thickness $T_2$.

Figure 3:
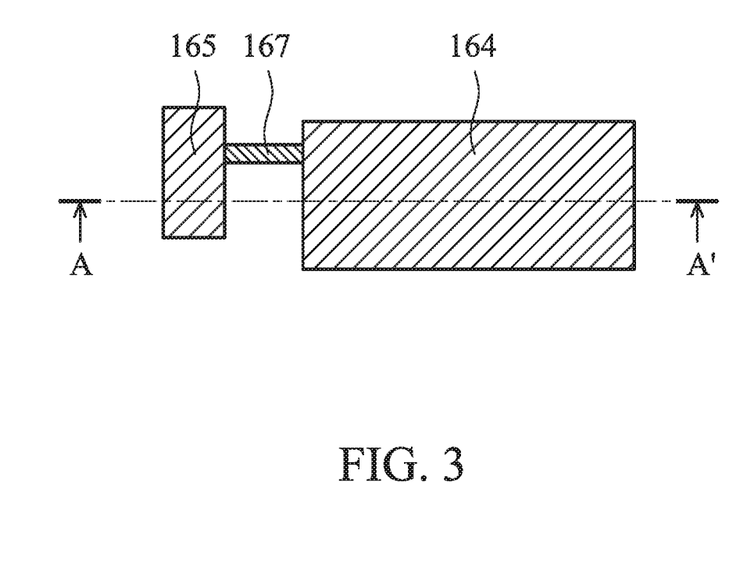
FIG. 3 shows a top-view of the region A of FIG. 1E, in accordance with some embodiments of the disclosure.

FIG. 3 shows a top-view of the region A of FIG. 1E, in accordance with some embodiments of the disclosure. FIG. 2 is a cross-sectional representation taken along the AA' line of FIG. 3.

A via 167 is formed between the metal shield structure 164 and the conductive structure 165. The via 167 and the conductive structure 165 are not in the same horizontal plane. The via 167 is made of conductive material, such as metal material. The metal material may be tungsten (W), copper (Cu), aluminum (Al), titanium (Ti), tantalum (Ta), nickel (Ni), silver (Ag), gold (Au), indium (In), tin (Sn), or a combination thereof. The metal shield structure 164 is electrically connected to the conductive structure 165 through a via 167. If the metal shield structure 164 is not electrically connected to the conductive structure 165, some charges (such as electrons) may accumulate in the metal shield structure 164. The accumulated charges may adversely affect the performance of the image sensor device structure. By connecting the metal shield structure 164 to the conductive structure 165 through the via 167, the charges in the metal shield structure 164 may be transferred to the conductive structure 165 through the via 167, and the conductive structure 165 is then grounded.

Figure 1F:
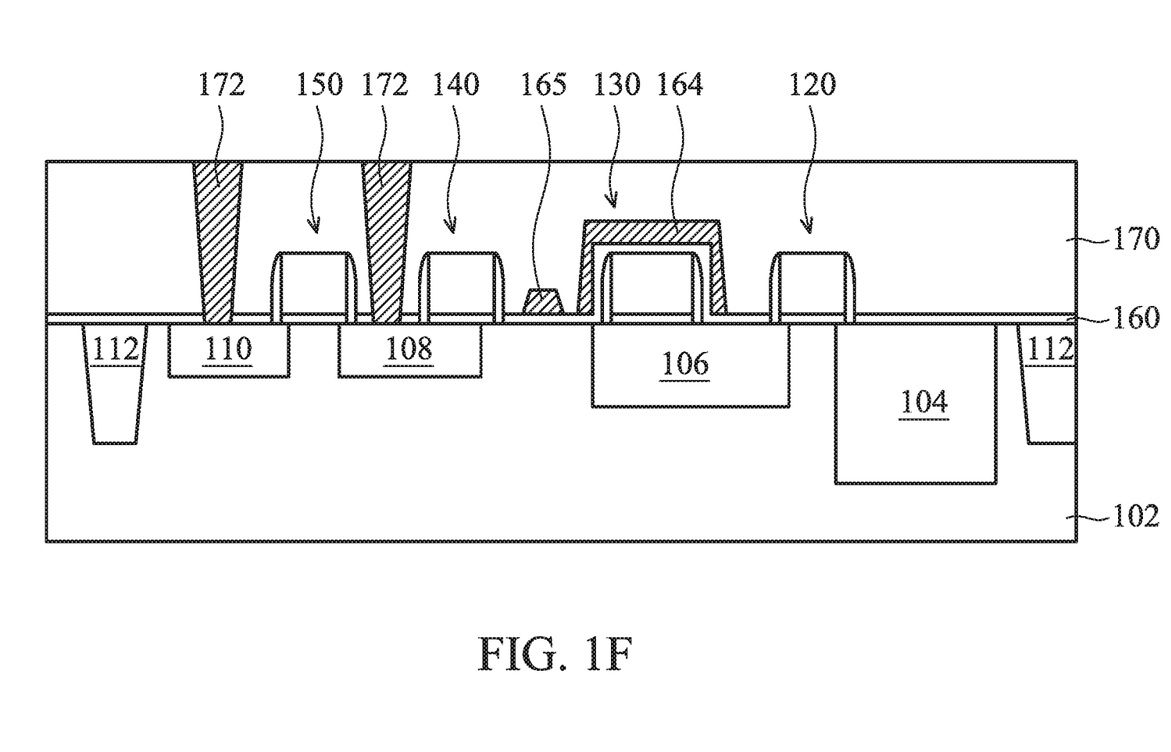

Afterwards, as shown in FIG. 1F, an inter-layer dielectric (ILD) layer 170 is formed over the first gate structure 120, the second gate structure 130, the third gate structure 140, the fourth gate structure 150, the metal shield structure 164 and the conductive structure 165, in accordance with some embodiments of the disclosure.

The ILD layer 170 may include multilayers made of multiple dielectric materials, such as silicon oxide, silicon nitride, silicon oxynitride, tetraethoxysilane (TEOS), phosphosilicate glass (PSG), borophosphosilicate glass (BPSG), low-k dielectric material, and/or other applicable dielectric materials. The ILD layer 170 may be formed by chemical vapor deposition (CVD), physical vapor deposition, (PVD), atomic layer deposition (ALD), spin-on coating, or another applicable process.

Afterwards, a contact plug structure 172 is formed in the ILD layer 170. The contact plug structure 172 is formed by removing a portion of the ILD layer 170 to form a trench, and then filling a conductive material into the trench to form the contact plug structure 172. The contact plug structure 172 has a top surface with a first width and a bottom surface with a second width, and the first width is greater than the second width. The contact plug structure 172 has a width gradually tapered from the top surface to the bottom surface.

In some embodiments, the contact plug structure 172 is made of metal materials, such as tungsten (W), copper (Cu), aluminum (Al), titanium (Ti), tantalum (Ta), nickel (Ni), silver (Ag), gold (Au), indium (In), tin (Sn) or a combination thereof. In some embodiments, the contact plug structure 172 is formed by electro-plating, electroless plating, sputtering, chemical vapor deposition (CVD) or another applicable process. In some embodiments, the metal shield structure 164 and the contact plug structure 172 are both made of the same material, such as tungsten (W). The tungsten (W) has a better gap filling ability than other metal materials.

Figure 1G:
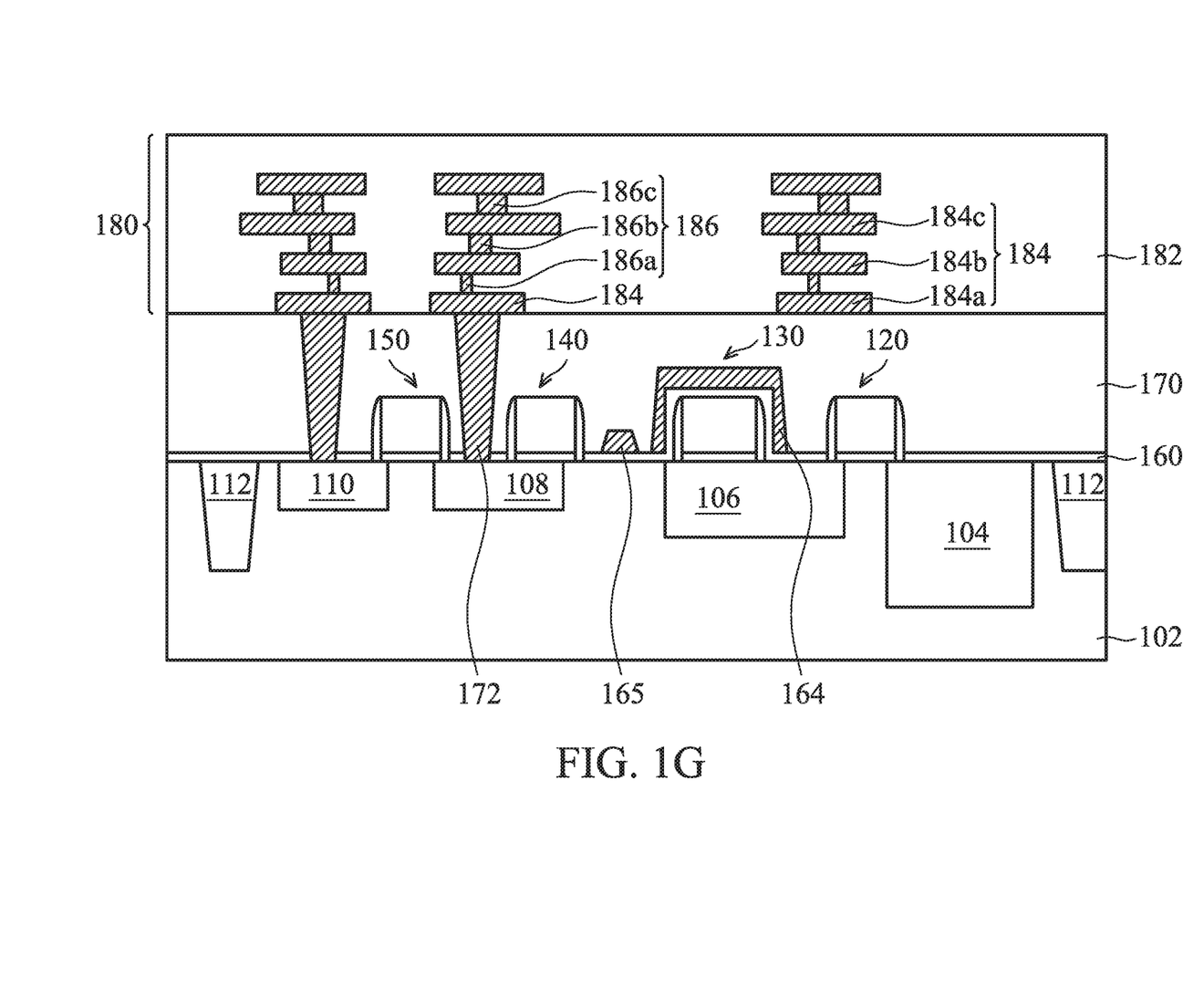

Afterwards, as shown in FIG. 1G, an interconnect structure 180 is formed over the ILD layer 170, in accordance with some embodiments of the disclosure. The interconnect structure 180 is used to electrically connect the signal of the gate structures 120, 130, 140 and 150 to external environment.

The interconnect structure 180 includes multiple conductive features formed in the dielectric layer 182 (such as inter-metal dielectric, IMD). The dielectric layer 182 includes a multiple dielectric layers. The dielectric layer 182 may include silicon oxide, silicon oxynitride, borosilicate glass (BSG), phosphoric silicate glass (PSG), borophosphosilicate glass (BPSG), fluorinated silicate glass (FSG), low-k material, porous dielectric material, or a combination thereof. In some embodiments, the dielectric layer 182 is formed by a chemical vapor deposition (CVD) process, a spin-on process, a sputtering process, or a combination thereof.

In some embodiments, the dielectric layer 182 is made of an extreme low-k (ELK) dielectric material with a dielectric constant (k) less than about 2.5. With geometric size shrinking as technology nodes advance to 30 nm and beyond, ELK dielectric material is used to minimize device RC (time constant, R: resistance, C: capacitance) delay. In some embodiments, ELK dielectric materials include carbon doped silicon oxide, amorphous fluorinated carbon, parylene, benzocyclobutenes (BCB), polytetrafluoroethylene (PTFE) (Teflon), or silicon oxycarbide polymers (SiOC). In some embodiments, ELK dielectric materials include a porous version of an existing dielectric material, such as hydrogen silsesquioxane (HSQ), porous methyl silsesquioxane (MSQ), porous polyarylether (PAE), or porous silicon oxide ($SiO_2$).

The conductive features include a number of conductive lines 184a, 184b, 184c and a number of conductive vias 186a, 186b, 186c. Each of the conductive lines 184a, 184b, 184c is electrically connected to the one of the conductive vias 186a, 186b, 186c. The conductive lines 184a, 184b, 184c are electrically connected to the contact plug structure 172.

In some embodiments, the first conductive line 184a is called a first metal layer ($M_1$), the second conductive line 184 is called a second metal layer ($M_2$), and the third conductive line 184c is called a third metal layer ($M_3$).

In some embodiments, the conductive features are made of metal materials, such as copper (Cu), aluminum (Al), titanium (Ti), tantalum (Ta), nickel (Ni), silver (Ag), gold (Au), indium (In), tin (Sn) or a combination thereof. In some embodiments, the conductive features are formed by electroplating, electroless plating, sputtering, chemical vapor deposition (CVD) or another applicable process.

The conductive lines 184a, 184b and 184c and the conductive vias 186a and 186b, 186c illustrated are exemplary, and the actual positioning and configuration of the conductive lines 184a, 184b, 184c and the conductive vias 186a, 186b, 186c may vary according to actual application.

Figure 1H:
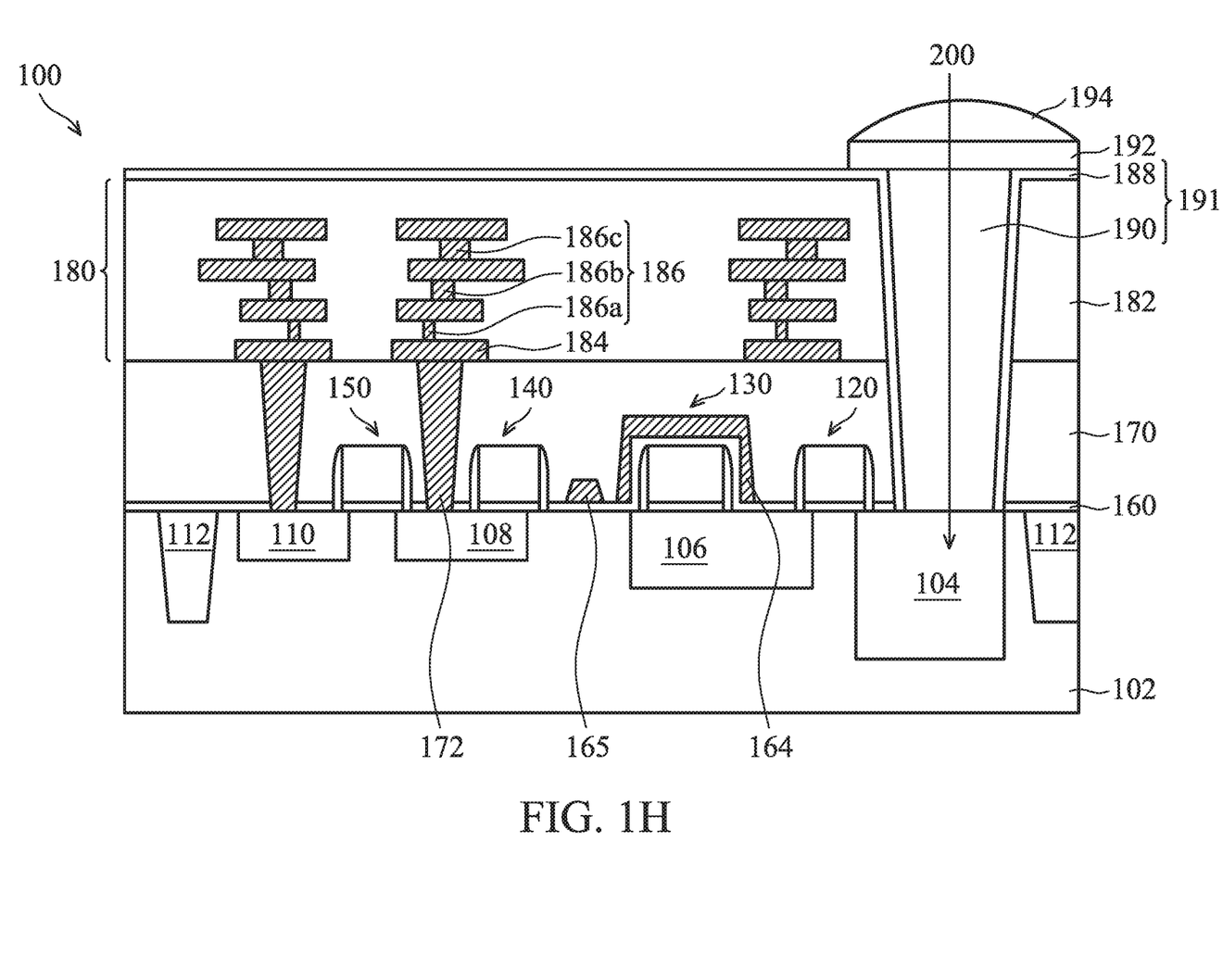

Next, as shown in FIG. 1H, a trench (not shown) is formed in the dielectric layer 182 and the ILD layer 170, and then a liner layer 188 is formed on the sidewall surfaces and a bottom surface of the trench, in accordance with some embodiments of the disclosure.

Next, a transparent dielectric layer 190 is formed on the liner layer 188, and a planarizing process is performed to remove the excess of the transparent dielectric layer 190 outside of the trench. Therefore, a light pipe 191 is formed by the liner layer 188 and the transparent dielectric layer 190, and light pipe 191 has a planar top surface.

The liner layer 188 is used as a protection layer to isolate the transparent dielectric layer 190 and the adjacent layers, such as dielectric layers 182 of the interconnect structure 180. In some embodiments, the liner layer 188 is made of dielectric materials, such as silicon oxide or silicon nitride. In some embodiments, the liner layer 188 is formed by a deposition process, such as a chemical vapor deposition process (CVD), a physical vapor deposition process (PVD), a spin-on coating process or another applicable process.

The transparent dielectric layer 190 is used to provide a path for transmitting the light from top to bottom. The transparent dielectric layer 190 has a refractive index that is higher than the refractive index of the dielectric layers 182 of the interconnect structure 180. In some embodiments, the transparent dielectric layer 190 is made of silicon nitride, BPSG (boro-phospho-silicate glass), or another applicable material. In some other embodiments, the transparent dielectric layer 190 is made of polymer material, such as polymethyl methacrylate (PMMA), polycarbonate (PC), epoxy, cellulose acetate, cellulose propionate, other suitable polymer materials, or combinations thereof. The transparent dielectric layer 190 is formed by a spin-on process, a chemical vapor deposition (CVD) process or another applicable process.

Afterwards, a color filter layer 192 is formed over the light pipe 191, and a microlens structure 194 is formed over the color filter layer 192. The color filter layer 192 aligned with the pixel region 104 is configured to filter visible light and allow light in the specific wavelength to pass through the dielectric layer 182 of the interconnect structure 180 to the pixel region 104.

The color filter layer 192 may be made of dye-based (or pigment-based) polymer for filtering out a specific frequency band (for example, a desired wavelength of light). In some other embodiments, the color filter layer 192 is made of resins or other organic-based materials having color pigments.

In some embodiments, the microlens structure 194 has a curved upper surface. The microlens structure 194 may have different shapes and sizes depending on the index of refraction of the material used for the microlens structure 194.

As shown in FIG. 1H, a light 200 is disposed over the microlens structure 194. The microlens structures 194 direct the light 200 to the respective the color filter layer 192. Then, the light 200 passes through the color filter layer 192 to the corresponding pixel region 104.

When the light 200 enters into the pixel region 104, the pixel region 104 generates electrons proportional to an amount of light falling on the pixel region 104. The electrons are converted into a voltage signal in the pixel region 042 and further transformed into digital signal. The storage region 106 is capable of temporarily storing charges transferred from the pixel region 104. The charges are then transferred from the storage region 106 to the floating node region 108.

In order to prevent the light from entering the second gate structure 130, the metal shield structure 164 surrounds the second gate structure 130. The metal shield structure 164 performs the function of reflecting the incident light and preventing stray light from entering the second gate structure 130. Accordingly, the quantum efficiency of the FSI image sensor device structure 100 is improved and crosstalk is reduced. Furthermore, the global shutter efficiency of the FSI image sensor device structure 100 is increased.

Figure 4:
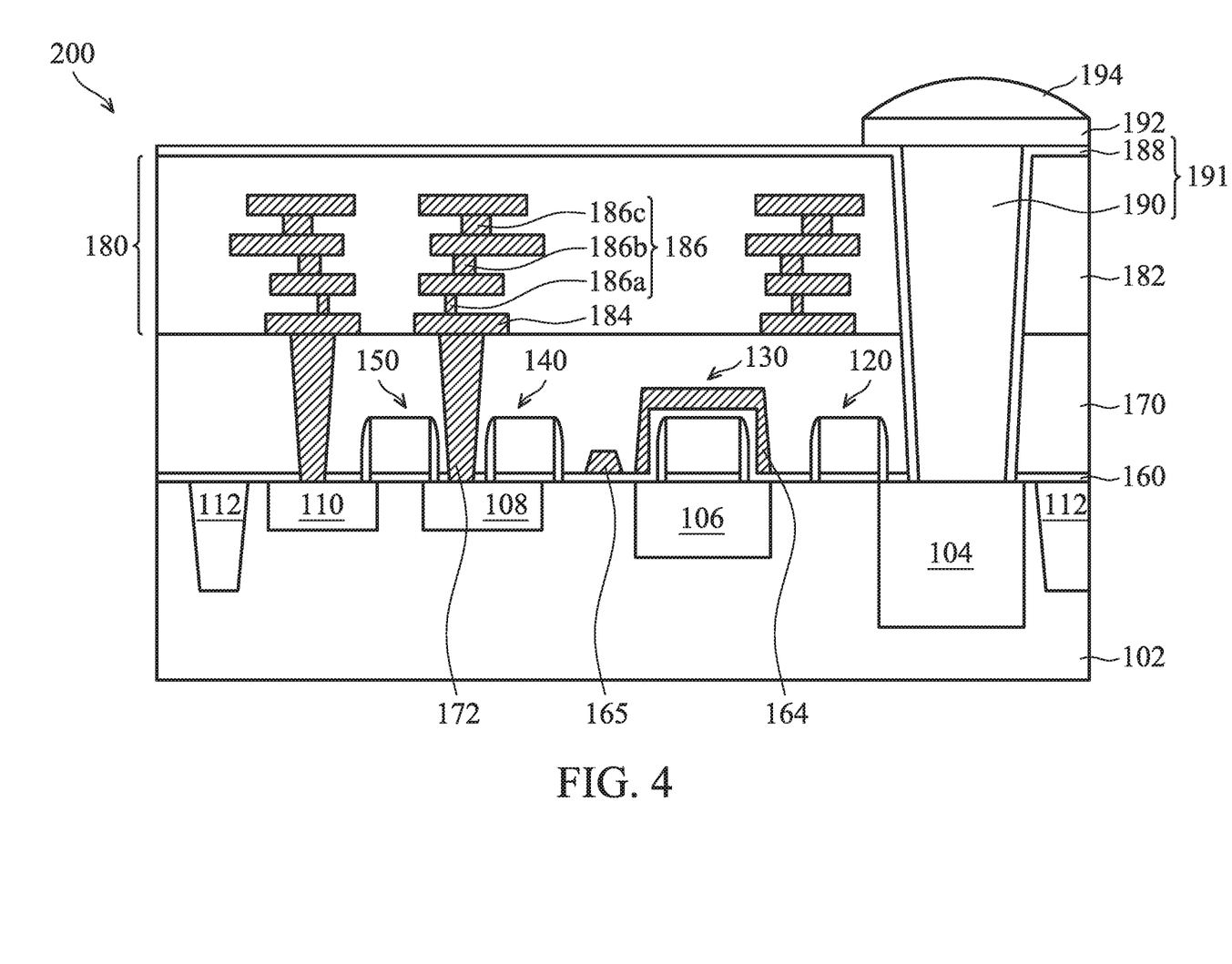
FIG. 4 shows a cross-sectional representation of a FSI image sensor device structure, in accordance with some embodiments of the disclosure.

FIG. 4 shows a cross-sectional representation of a FSI image sensor device structure 200, in accordance with some embodiments of the disclosure. Some processes and materials used to form the FSI image sensor device structure 200 are similar to, or the same as, those used to form the FSI image sensor device structure 100 and are not repeated herein.

The difference between the image sensor device structure 200 in FIG. 4 and the image sensor device structure 100 in FIG. 1H is that the storage region 106 is fully covered by the second gate structure 130 and the metal shield structure 164. More specifically, the outer sidewall surface of the metal shield structure 164 is aligned with a boundary of the storage region 106. The metal shield structure 164 is directly formed on the storage region 106 to increase the shielding effect for the storage region 106. The metal shield structure 164 performs the function of reflecting the incident light and preventing stray light from entering the storage region 106. Accordingly, the quantum efficiency of the FSI image sensor device structure 200 is improved and crosstalk is reduced.

Embodiments for forming an FSI image sensor device structure and method for formation of the same are provided. The FSI image sensor device structure includes a pixel region, and a storage region adjacent to the pixel region. The FSI image sensor device structure further includes a storage gate structure on the storage region and a metal shield structure on the storage gate structure. The top surface and the sidewall surfaces of the storage gate structure are completely covered by the metal shield structure to improve the shielding effect. In addition, the metal shield structure is not formed by a CMP process, and the uniformity of thickness of the metal shield structure is improved. Therefore, the global shutter efficiency is increased and the performance of the FSI image sensor device structure is improved.

In some embodiments, an FSI image sensor device structure is provided. The FSI image sensor device structure includes a pixel region formed in a substrate and a storage region formed in the substrate and adjacent to the pixel region. The FSI image sensor device structure further includes a first gate structure formed over the storage region and a metal shield structure formed over the first gate structure. The FSI image sensor device structure further includes a conductive structure formed adjacent to the first gate structure. In addition, the conductive structure is electrically connected to the metal shield structure through a via.

In some embodiments, an FSI image sensor device structure is provided. The FSI image sensor device structure includes a storage region formed in a substrate and a floating node region formed in the substrate and adjacent to the storage region. The FSI image sensor device structure further includes a metal shield structure formed over the storage region, and the metal shield structure has a first height measured from a top surface of the substrate to a top surface of the metal shield structure. The FSI image sensor device structure further includes a conductive structure between the storage region and the floating node region. In addition, the conductive structure has a second height measured from the top surface of the substrate to a top surface of the conductive structure, and the second height is smaller than the first height. The FSI image sensor device structure further includes a contact plug structure formed on the floating node region. In addition, the contact plug has a third height measured from the top surface of the substrate to a top surface of the contact plug structure, and the third height is greater than the first height.

In some embodiments, an FSI image sensor device structure is provided. The FSI image sensor device structure includes a storage region formed in a substrate and a first gate structure formed on the storage region. The FSI image sensor device structure further includes a floating node region formed in the substrate and adjacent to the storage region and a second gate structure formed on the floating node region. The FSI image sensor device structure further includes a metal shield structure formed over the storage gate structure and a conductive structure between the first gate structure and the second gate structure. In addition, the metal shield structure has a tapered sidewall portion.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A front side illuminated (FSI) image sensor device structure, comprising:
    a pixel region formed in a substrate;
    a storage region formed in the substrate and adjacent to the pixel region;
    a first gate structure formed over the storage region,
    a metal shield structure formed over the first gate structure;
    a conductive structure formed adjacent to the first gate structure, wherein the conductive structure is electrically connected to the metal shield structure through a via, and a top surface of the conductive structure is lower than a top surface of the metal shield structure; and
    a second gate structure formed over the pixel region, wherein a top surface of the second gate structure is higher than the top surface of the conductive structure and lower than the top surface of the metal shield structure.

2. The front side illuminated (FSI) image sensor device structure as claimed in claim 1, wherein the metal shield structure comprises a top portion and a sidewall portion, the top portion is over a top surface of the first gate structure, and the sidewall portion is over sidewall surfaces of the first gate structure.

3. The front side illuminated (FSI) image sensor device structure as claimed in claim 1, wherein a sidewall portion of the metal shield structure is between the first gate structure and the conductive structure.

4. The front side illuminated (FSI) image sensor device structure as claimed in claim 1, further comprising:
    a light pipe formed over the pixel region;
    a color filter layer formed over the light pipe; and
    a microlens structure formed over the color filter layer.

5. The front side illuminated (FSI) image sensor device structure as claimed in claim 1, wherein a bottom surface of the conductive structure is level with a bottom surface of the metal shield structure.

6. The front side illuminated (FSI) image sensor device structure as claimed in claim 1, wherein the conductive structure has a top surface with a first width and a bottom surface with a second width, and the second width is greater than the first width and a sloping sidewall between the top surface and the bottom surface.

7. The front side illuminated (FSI) image sensor device structure as claimed in claim 1, wherein the storage region is fully covered by the metal shield structure.

8. The front side illuminated (FSI) image sensor device structure as claimed in claim 1, further comprising:
    a floating node region formed in the substrate and adjacent to the storage region, wherein the conductive structure is between the floating node region and the storage region.

9. The front side illuminated (FSI) image sensor device structure as claimed in claim 8, further comprising:
    a contact plug structure formed on the floating node region, wherein a top surface of the contact plug structure is higher than a top surface of the metal shield structure.

10. The front side illuminated (FSI) image sensor device structure as claimed in claim 1, wherein the conductive structure is not vertically overlapped with the metal shield structure.

11. A front side illuminated (FSI) image sensor device structure, comprising:
    a storage region formed in a substrate;
    a floating node region formed in the substrate and adjacent to the storage region;
    a storage gate structure formed on the storage region;
    an etching stop layer formed on the storage gate structure, wherein the etching stop layer has a top surface on the storage gate structure;
    a metal shield structure formed over the storage region, wherein the metal shield structure has a first height measured from a top surface of the substrate to a top surface of the metal shield structure, and the metal shield structure is in direct contact with an entirety of the top surface of the etching stop layer;
    a conductive structure between the storage region and the floating node region, wherein the conductive structure has a second height measured from the top surface of the substrate to a top surface of the conductive structure, and the second height is smaller than the first height;
    a contact plug structure formed on the floating node region, wherein the contact plug structure has a third height measured from the top surface of the substrate to a top surface of the contact plug structure, and the third height is greater than the first height; and
    a second gate structure formed over the pixel region, wherein a top surface of the second gate structure is higher than the top surface of the conductive structure and lower than the top surface of the metal shield structure.

12. The front side illuminated (FSI) image sensor device structure as claimed in claim 11, wherein the metal shield structure has a sidewall portion which is directly formed on a sidewall of the storage gate structure, and the sidewall portion of the metal shield structure is between the storage gate structure and the conductive structure.

13. The front side illuminated (FSI) image sensor device structure as claimed in claim 12, wherein the sidewall portion has a first outer sidewall and a second outer sidewall, the first outer sidewall is aligned with a first outer boundary of the storage region and the second outer sidewall is aligned with a second outer boundary of the storage region.

14. The front side illuminated (FSI) image sensor device structure as claimed in claim 11, wherein the conductive structure is electrically connected to the metal shield structure through a via.

15. The front side illuminated (FSI) image sensor device structure as claimed in claim 11, wherein a bottom surface of the conductive structure is level with a bottom surface of the metal shield structure.

16. The front side illuminated (FSI) image sensor device structure as claimed in claim 11, further comprising:

a pixel region formed adjacent to the storage region;
a light pipe formed on the pixel region;
a color filter layer formed over the light pipe; and
a microlens structure over the color filter layer.

17. The front side illuminated (FSI) image sensor device structure as claimed in claim 11, wherein the conductive structure has a width which is tapered.

18. The front side illuminated (FSI) image sensor device structure as claimed in claim 11, wherein the conductive structure is not vertically overlapped with the metal shield structure.

19. A front side illuminated (FSI) image sensor device structure, comprising:
a storage region formed in a substrate;
a first gate structure formed on the storage region;
a floating node region formed in the substrate and adjacent to the storage region;
a second gate structure formed on the floating node region;
a metal shield structure formed over the first gate structure; and
a conductive structure between the first gate structure and the second gate structure, wherein the metal shield structure has a tapered sidewall portion, and a top surface of the second gate structure is higher than a top surface of the conductive structure and lower than a top surface of the metal shield structure.

20. The front side illuminated (FSI) image sensor device structure as claimed in claim 19, wherein the conductive structure is electrically connected to the metal shield structure through a via.

21. The front side illuminated (FSI) image sensor device structure as claimed in claim 19, wherein the tapered sidewall portion has a first outer sidewall and a second outer sidewall, the first outer sidewall is aligned with a first outer boundary of the storage region and the second outer sidewall is aligned with a second outer boundary of the storage region.

* * * * *